US012700564B2

(12) United States Patent
Takahashi et al.

(10) Patent No.: US 12,700,564 B2
(45) Date of Patent: Aug. 4, 2026

(54) CHARGED PARTICLE BEAM DEVICE AND VIBRATION-SUPPRESSING MECHANISM

(71) Applicant: Hitachi High-Tech Corporation, Tokyo (JP)

(72) Inventors: Hiroki Takahashi, Tokyo (JP); Shuichi Nakagawa, Tokyo (JP); Toshihiko Shimizu, Tokyo (JP); Kiyoshi Yabata, Tokyo (JP); Hironori Ogawa, Tokyo (JP); Jun Etoh, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 354 days.

(21) Appl. No.: 17/791,585

(22) PCT Filed: Jan. 30, 2020

(86) PCT No.: PCT/JP2020/003529
§ 371 (c)(1),
(2) Date: Jul. 8, 2022

(87) PCT Pub. No.: WO2021/152793
PCT Pub. Date: Aug. 5, 2021

(65) Prior Publication Data
US 2023/0035686 A1 Feb. 2, 2023

(51) Int. Cl.
*H01J 37/26* (2006.01)
*F16F 15/00* (2006.01)
(Continued)

(52) U.S. Cl.
CPC ............ *H01J 37/261* (2013.01); *H01J 37/28* (2013.01); *H02N 2/005* (2013.01); *H01J 2237/0216* (2013.01)

(58) Field of Classification Search
CPC .. H01J 37/261; H01J 37/28; H01J 2237/0216; H01J 37/16; H02N 2/005; F16F 2230/08; F16F 15/007
See application file for complete search history.

(56) References Cited

U.S. PATENT DOCUMENTS

2009/0201484 A1    8/2009  Arai
2009/0207393 A1*   8/2009  Butler ..................... F16F 15/02
                                                        355/53
(Continued)

FOREIGN PATENT DOCUMENTS

JP        8-195179  A      7/1996
JP        H08195179 A   * 10/1996
(Continued)

OTHER PUBLICATIONS

JP2001027280A English Translation from Espacenet (Year: 2001).*
(Continued)

*Primary Examiner* — David E Smith
*Assistant Examiner* — Laura Eloise Tandy
(74) *Attorney, Agent, or Firm* — Crowell & Moring LLP

(57) ABSTRACT

Provided are a vibration-suppressing mechanism that has excellent maintainability and can effectively control vibration of a column, and a charged particle beam device using the same. This charged particle beam device comprises: a sample chamber for accommodating a sample that will serve as an object to be observed therein; a column that is disposed on an upper portion of the sample chamber and irradiates and scans the sample with a charged particle beam generated by a charged particle source; and a vibration-suppressing mechanism that is removably provided to the column, said particle beam device being characterized in that the vibration-suppressing mechanism includes a stator affixed to the column, an annular mover that is supported so as to be movable in a direction orthogonal to the axial direction of
(Continued)

the column, a plurality of actuators that cause the mover to vibrate in the direction orthogonal to the axial direction of the column, a plurality of vibration sensors affixed to the stator, and a controller that controls the actuators according to output signals from the vibration sensors.

14 Claims, 8 Drawing Sheets

(51) Int. Cl.
 H01J 37/16 (2006.01)
 H01J 37/28 (2006.01)
 H02N 2/00 (2006.01)

(56) References Cited

U.S. PATENT DOCUMENTS

2019/0145490 A1* 5/2019 Takahashi ............... G03F 7/709
 267/136
2019/0157037 A1 5/2019 Tomimatsu et al.

FOREIGN PATENT DOCUMENTS

| JP | 2001-27280 | A | | 1/2001 | | |
| JP | 2001027280 | A | * | 1/2001 | .............. | F16F 15/02 |
| JP | 2009-127861 | A | | 6/2009 | | |
| JP | 2018-5975 | A | | 1/2018 | | |
| JP | 2021086502 | A | * | 6/2021 | | |
| TW | 200928609 | A | | 7/2009 | | |
| TW | 201827945 | A | | 8/2018 | | |

OTHER PUBLICATIONS

JP2021086502A English Translation form Espacenet (Year: 2021).*
JPH08195179A English Translation from Espacenet (Year: 1996).*
English Translation (Year: 2001).*
English Translation (Year: 2021).*
English Translation (Year: 1996).*
International Search Report (PCT/ISA/210) issued in PCT Application No. PCT/JP2020/003529 dated Apr. 7, 2020 with English translation (four (4) pages).
Japanese-language Written Opinion (PCT/ISA/237) issued in PCT Application No. PCT/JP2020/003529 dated Apr. 7, 2020 (four (4) pages).
Taiwanese-language Office Action issued in Taiwanese Application No. 109146461 dated Dec. 28, 2021 (five (5) pages).

* cited by examiner

CHARGED PARTICLE BEAM DEVICE AND VIBRATION-SUPPRESSING MECHANISM

TECHNICAL FIELD

The present invention relates to a charged particle beam device such as a scanning electron microscope, and particularly to a charged particle beam device capable of suppressing vibration of the device that causes image blur.

BACKGROUND ART

With miniaturization of semiconductor elements in recent years, semiconductor manufacturing apparatuses and inspection apparatuses are also required to have high accuracy and high throughput. In order to evaluate the shape and dimensions of a pattern formed on a semiconductor wafer and to inspect defects, a scanning electron microscope (SEM) which is one of charged particle beam devices is used.

In a process of measuring or inspecting a wafer by the SEM, the wafer is irradiated with a charged particle beam from an electron gun provided at the upper portion of a column, an observation image is acquired by detecting secondary electrons emitted from the wafer, and pattern dimensions are measured and defects are observed from a change in brightness.

By the way, when a charged particle beam correction device or the like is added in order to further increase the resolution of the SEM, the size of the column increases and this causes a decrease in the rigidity of the column. In addition, when the speed of a stage for moving the wafer is increased in order to improve the throughput, a drive reaction force during a stage operation increases. As a result, the vibration of the column at the time of wafer observation increases, and the distortion of the observation image and the vibration of a pattern edge occur due to the variation of the irradiation position of the charged particle beam (also referred to as "image blur" below).

As the related art of the present technical field, for example, there is a technique such as PTL 1. PTL 1 discloses a charged particle beam device including a vibration-suppressing mechanism that is easily detached.

CITATION LIST

Patent Literature

PTL 1: JP 2018-5975 A

SUMMARY OF INVENTION

Technical Problem

In a case where an active vibration-suppressing mechanism using a vibration sensor and a vibration exciter (actuator) is adopted as in PTL 1, it is necessary to consider the lifetime of the actuator. In a case where the actuator needs to be replaced due to the failure or the lifetime, it is desirable that the actuator be easily replaced.

In addition, as described above, in a charged particle beam device such as an SEM, further improvement in accuracy (high resolution) and improvement in throughput are required, and suppression of device vibration, particularly, suppression of vibration of a column, which causes image blur, is an important problem.

The vibration-suppressing mechanism in PTL 1 has structure that can be easily attached to and detached from a column by a fixing ring and a bolt. However, only one set of a vibration exciter (actuator) paired with a vibration sensor is disposed in each of an X-direction and a Y-direction, and the effect of reducing vibration is limited.

Thus, an object of the present invention is to provide a vibration-suppressing mechanism that has excellent maintainability and can effectively control vibration of a column and a charged particle beam device using the same.

Solution to Problem

To solve the above problems, the present invention includes a sample chamber for accommodating a sample that will serve as an object to be observed therein, a column that is disposed on an upper portion of the sample chamber and irradiates and scans the sample with a charged particle beam generated by a charged particle source, and a vibration-suppressing mechanism that is removably provided to the column. The vibration-suppressing mechanism includes a stator affixed to the column, an annular mover that is supported so as to be movable in a direction orthogonal to an axial direction of the column, a plurality of actuators that cause the mover to vibrate in the direction orthogonal to the axial direction of the column, a plurality of vibration sensors affixed to the stator, and a controller that controls the actuators according to output signals from the vibration sensors.

Further, according to the present invention, a vibration-suppressing mechanism is removably provided to a column of a charged particle beam device and suppresses vibration generated in the column. The vibration-suppressing mechanism includes a stator affixed to the column, an annular mover that is supported so as to be movable in a direction orthogonal to an axial direction of the column, a plurality of actuators that cause the mover to vibrate in the direction orthogonal to the axial direction of the column, a plurality of vibration sensors affixed to the stator, and a controller that controls the actuators according to output signals from the vibration sensors.

Advantageous Effects of Invention

According to the present invention, it is possible to provide a vibration-suppressing mechanism that has excellent maintainability and can effectively control vibration of a column and a charged particle beam device using the same. Thus, it is possible to improve the accuracy (resolution) and throughput of the charged particle beam device.

Objects, configurations, and advantageous effects other than those described above will be clarified by the descriptions of the following embodiments.

DESCRIPTION OF EMBODIMENTS

Figure 1:
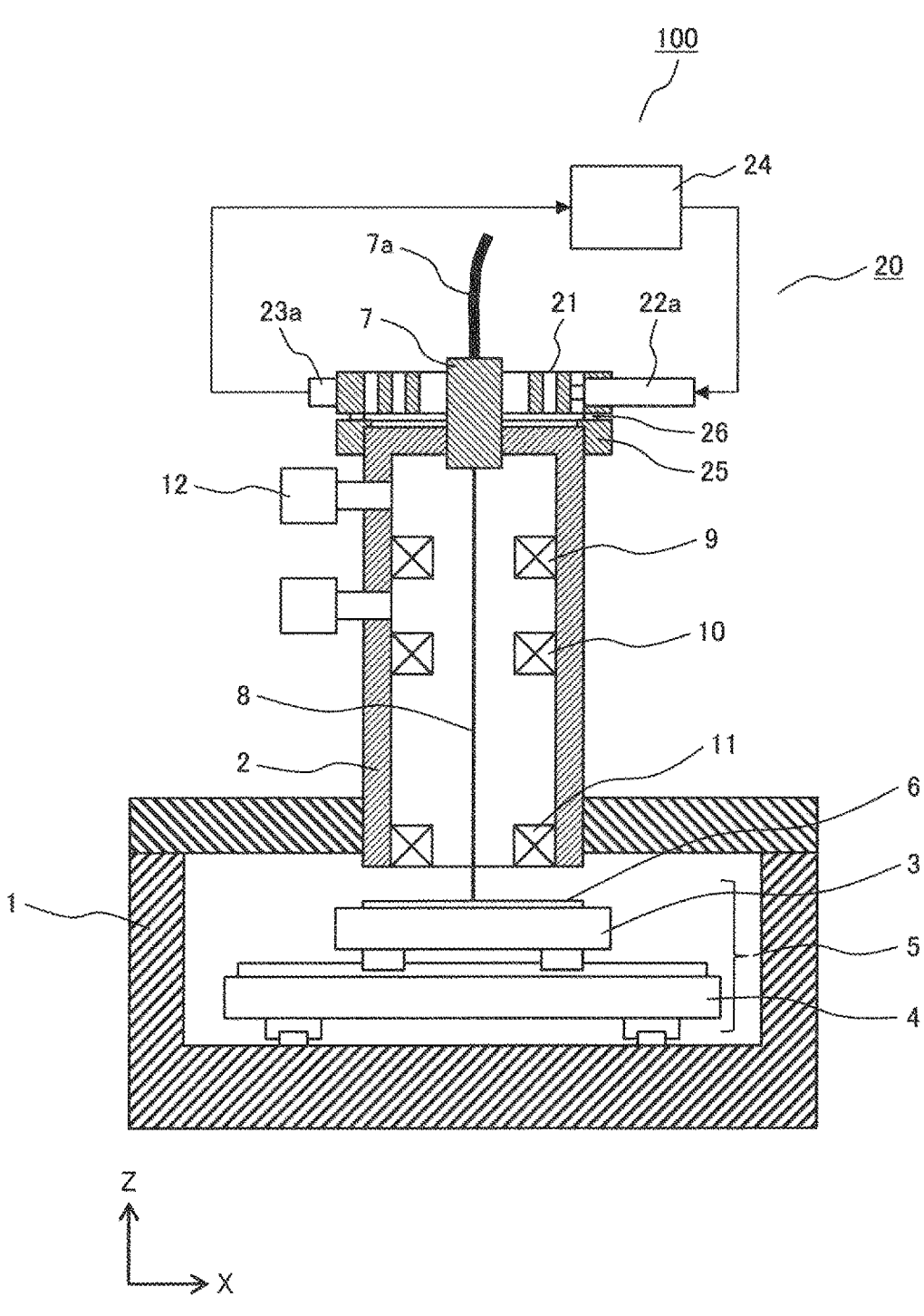
FIG. 1 is a cross-sectional view illustrating a schematic configuration of a charged particle beam device according to Embodiment 1.

Hereinafter, embodiments of the present invention will be described with reference to the drawings. In the drawings, the same components are denoted by the same reference signs, and the detailed description of the repetitive parts will be omitted.

Embodiment 1

A vibration-suppressing mechanism and a charged particle beam device according to Embodiment 1 of the present invention will be described with reference to FIGS. 1 to 5.

Figure 2:
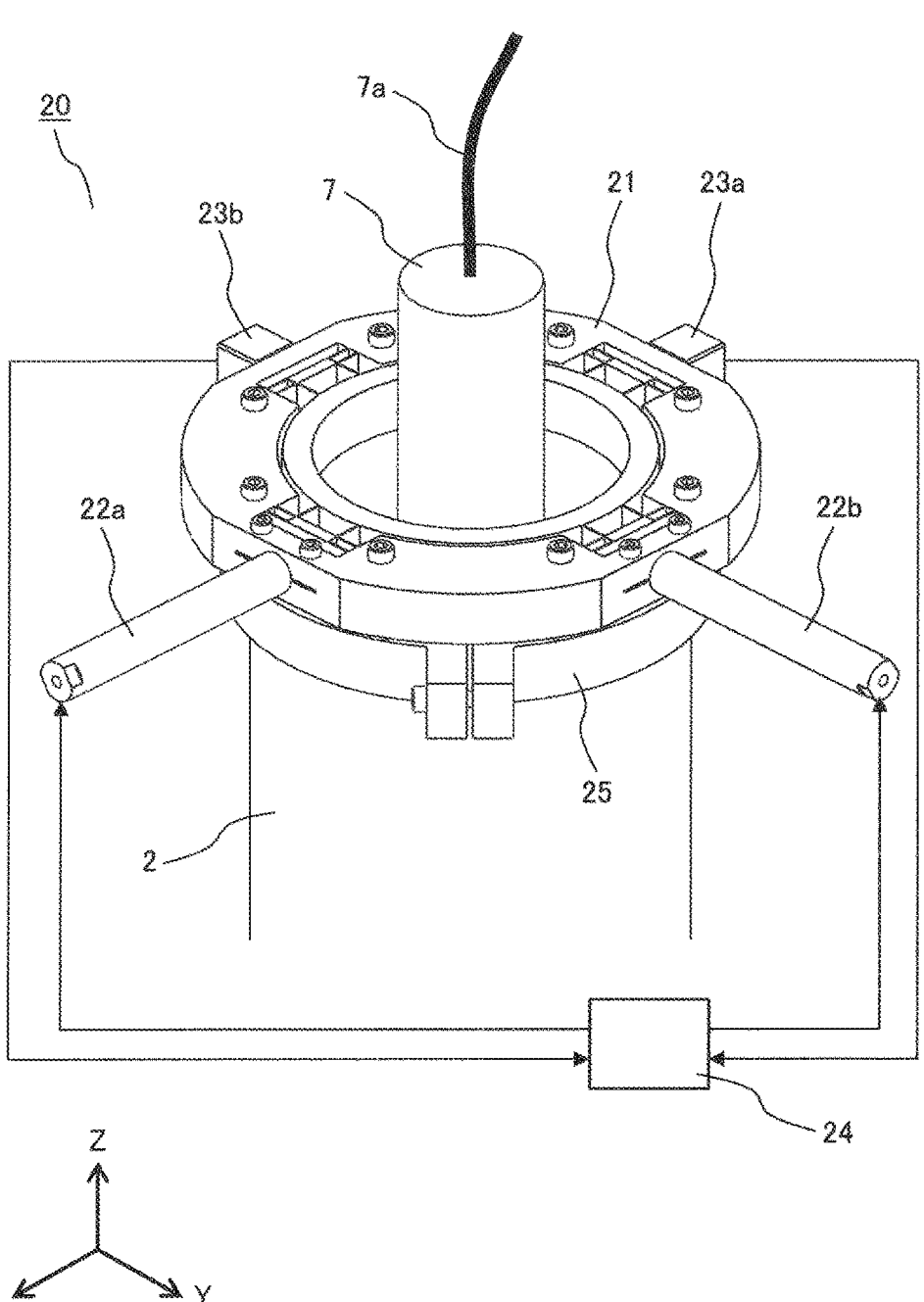
FIG. 2 is a perspective view of a vibration-suppressing mechanism in Embodiment 1.
Figure 3:
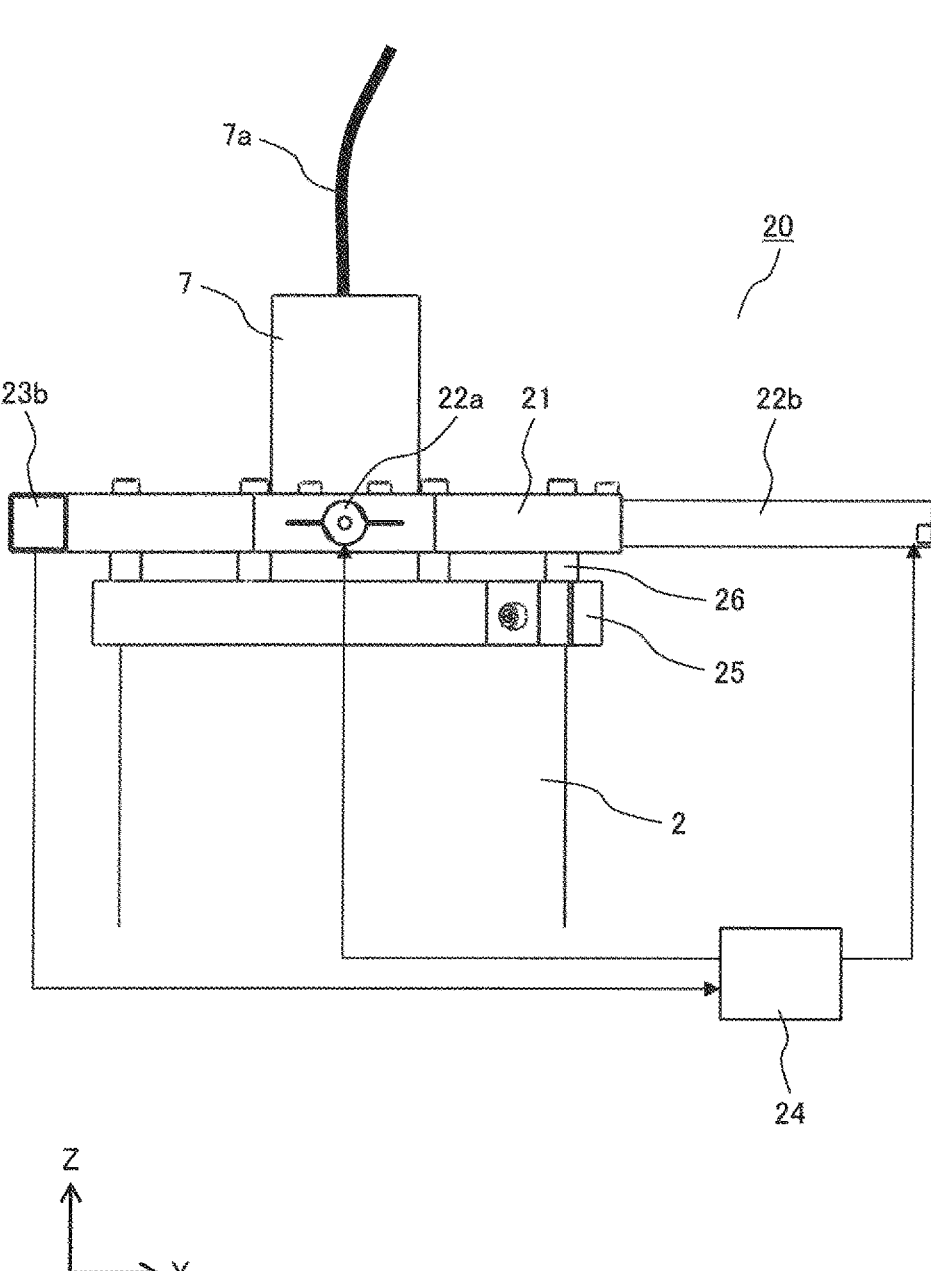
FIG. 3 is a side view of the vibration-suppressing mechanism in Embodiment 1.
Figure 4:
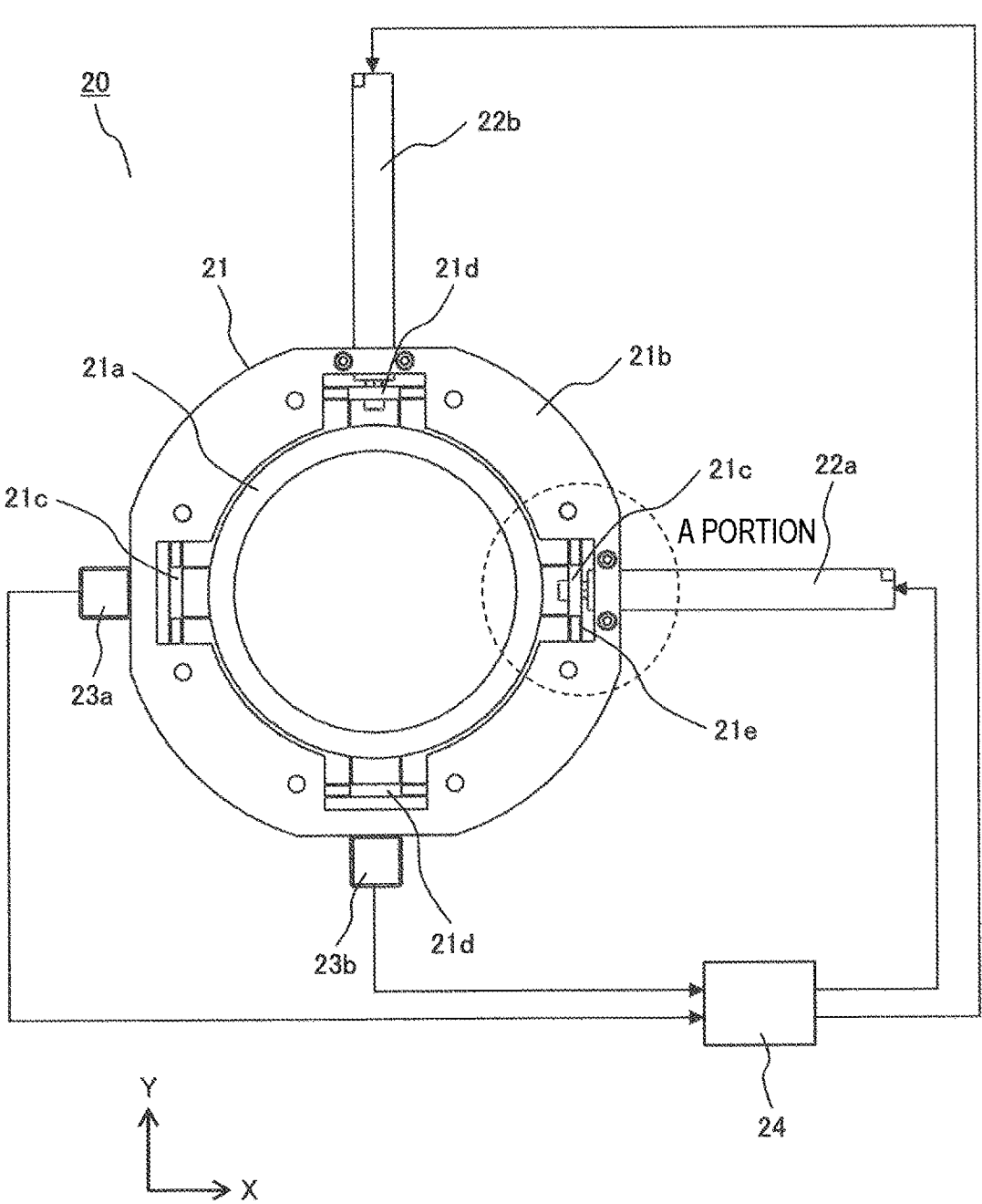
FIG. 4 is a plan view (top view) of the vibration-suppressing mechanism in Embodiment 1.
Figure 5:
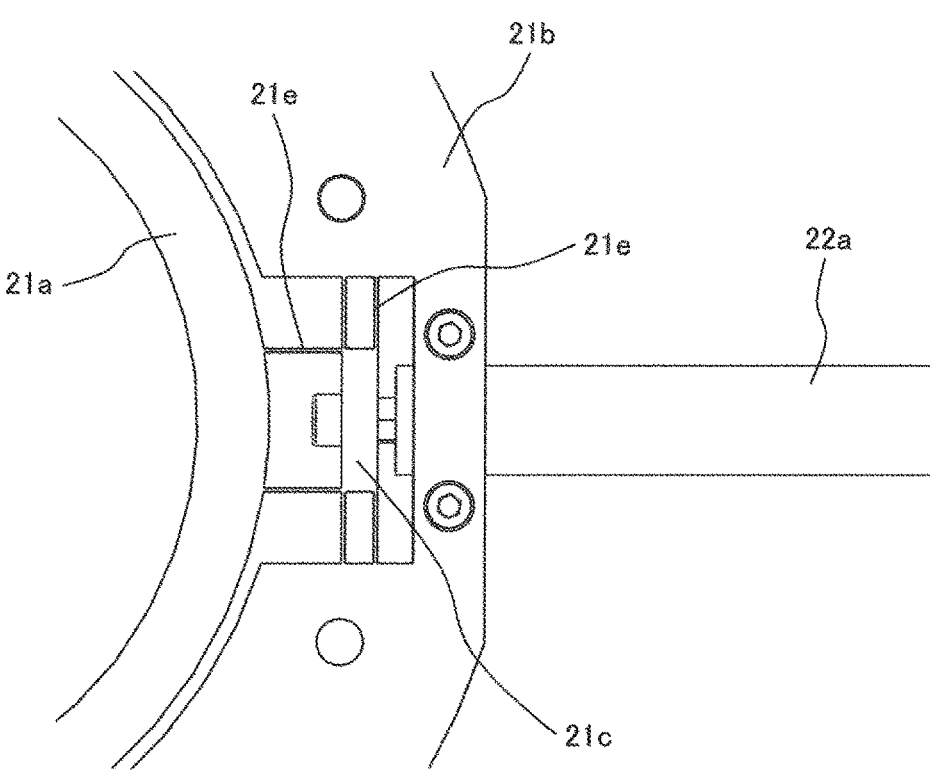
FIG. 5 is an enlarged view of a portion A in FIG. 4.
Figure 5:
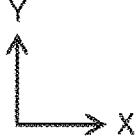

FIG. 1 is a cross-sectional view illustrating a schematic configuration of a charged particle beam device 100 in the present embodiment. FIGS. 2 and 3 are a perspective view and a side view of a vibration-suppressing mechanism 20, respectively, and illustrate a state of being attached to a column 2. FIG. 4 is a plan view (top view) of the vibration-suppressing mechanism 20, and FIG. 5 is an enlarged view of a portion A in FIG. 4. A coordinate system (X, Y, Z) is defined as illustrated in each drawing.

As illustrated in FIG. 1, the charged particle beam device 100 includes a sample chamber 1 and a column 2 provided at the upper portion of the sample chamber 1, as main components. A sample stage 5 configured by an X table 3 movable in the X-direction and a Y table 4 movable in the Y-direction is provided inside the sample chamber 1.

A sample 6 which will serve as an object to be observed is placed on the sample stage 5. The inside of the sample chamber 1 is maintained in a vacuum state by a turbo molecular pump (main pump) and a dry pump (auxiliary pump) (not illustrated).

An electron gun 7 is provided at the upper portion of the column 2. The electron gun 7 generates a primary electron beam 8 and irradiates the sample 6 through the inside of the column 2. A cable 7a to the electron gun 7 is guided from above the electron gun 7.

A condenser lens 9, a scanning deflector 10, and an objective lens 11 are provided inside the column 2. The inside of the column 2 is maintained in an ultrahigh vacuum state by evacuation using an ion pump 12. A fixing ring 25 is attached to the upper portion of the column 2, and the vibration-suppressing mechanism 20 is attached to the upper portion of the column 2 via a spacer 26.

As illustrated in FIGS. 2 and 3, the vibration-suppressing mechanism 20 includes an inertial mass member 21, actuators 22a and 22b provided on the inertial mass member 21, vibration sensors 23a and 23b provided on the inertial mass member 21, and a controller 24 that drives and controls the actuators 22a and 22b according to output signals of the vibration sensors 23a and 23b.

A detailed configuration of the vibration-suppressing mechanism 20 and an operation (action) thereof will be described with reference to FIGS. 4 and 5. FIG. 5 is an enlarged view of the portion A in FIG. 4, and illustrates details of an attachment portion of the actuator 22a.

The inertial mass member 21 includes an annular mover 21a and a stator 21b outside the mover 21a. The stator 21b is affixed to the fixing ring 25 via the spacer 26 (see FIG. 3). The mover 21a and the stator 21b are coupled to each other via an X-direction mover 21c, a Y-direction mover 21d, and a leaf spring 21e. The inertial mass member 21 may be formed as an integral component in which a portion for the leaf spring 21e is thinned.

The X-direction mover 21c is coupled to the stator 21b by the leaf spring 21e having a parallel flat plate structure, and is supported with low rigidity in the X-direction with respect to the stator 21b. Similarly, the Y-direction mover 21d is coupled to the stator 21b by the leaf spring 21e having a parallel flat plate structure, and is supported with low rigidity in the Y-direction with respect to the stator 21b.

The annular mover 21a is coupled to the X-direction mover 21c by the leaf spring 21e having a parallel plate structure, and is supported with low rigidity in the Y-direction with respect to the X-direction mover 21c. In addition, the mover 21a is coupled to the Y-direction mover 21d by the leaf spring 21e having a parallel plate structure, and is supported with low rigidity in the X-direction with respect to the Y-direction mover 21d.

The actuators 22a and 22b are multilayer piezoelectric elements accommodated in a cylindrical metal case in a state where a preload is applied. When a voltage is applied, tip end portions protruding from the metal case stretch and contract. The actuators 22a and 22b are inserted from the outside of the stator 21b in a state where the tip end portions face the mover 21a. The metal cases of the actuators 22a and 22b are affixed to the stator 21b.

The tip end portion of the actuator 22a is connected to the X-direction mover 21c, and the tip end portion of the actuator 22b is connected to the Y-direction mover 21d. The maximum stroke of the multilayer piezoelectric element is generally on the order of about 0.1% of the entire length, and the stretch/contraction amounts of the actuators 22a and 22b are as small as about several ten μm to several hundred μm at most.

When the actuator 22a stretches and contracts, the X-direction mover 21c connected to the tip end portion of the actuator 22a operates in the X-direction, and the mover 21a also operates in the X-direction. At this time, since the mover 21a and the Y-direction mover 21d are coupled with low rigidity in the X-direction, the Y-direction mover 21d does not hinder the operation of the mover 21a in the X-direction.

In the similar manner, when the actuator 22b is stretched and contracted, the Y-direction mover 21d connected to the tip end portion of the actuator 22b operates in the Y-direction, and the mover 21a also operates in the Y-direction. Since the stretch/contraction amounts of the actuators 22a and 22b are minute, the mover 21a can be independently operated in the X and Y-directions by the actuators 22a and 22b.

The vibration-suppressing mechanism 20 uses the drive reaction force of the mover 21a as a damping force against vibration generated in the column 2. The vibration sensors 23a and 23b are, for example, acceleration sensors, and are affixed to the stator 21b so as to detect vibration in the X-direction and the Y-direction, respectively. The vibration sensors 23a and 23b may be affixed to the column 2 or the fixing ring 25 so as to detect vibration of the column 2. In addition, a sensor other than the acceleration sensor may be used as long as the speed and the displacement can be detected.

The effects of the present embodiment will be described. The sample 6 being an object to be observed is positioned at a desired position by the sample stage 5. The primary electron beam 8 generated by the electron gun 7 is narrowed by the condenser lens 9 in the column 2, is emitted by the objective lens 11 while focusing on the surface of the sample 6, and causes two-dimensional scanning of the surface of the sample 6 by the scanning polarizer 10. Secondary electrons are emitted from the surface of the sample 6 irradiated with the primary electron beam 8 and detected by a secondary electron detector (not illustrated) to obtain an observation image.

Vibration generated in the column 2 due to a positioning operation of the sample stage 5, an operation of the ion pump 12, disturbance derived from an installation environment, or the like is detected by the vibration sensors 23*a* and 23*b*.

The controller 24 drives the actuators 22*a* and 22*b* so as to suppress the vibration of the column 2 according to the output signals of the vibration sensors 23*a* and 23*b*, and causes the mover 21*a* to vibrate so as to generate a damping force. Since the vibration of the column 2 at the time of observing the sample 6 is reduced, the vibration of the irradiation position of the primary electron beam 8 with respect to the sample 6 is also reduced, and image blur is suppressed. Thus, it is possible to obtain an observation image with higher accuracy.

Since the actuators 22*a* and 22*b* are provided from the outside of the inertial mass member 21, it is possible to easily attach and remove the actuators 22*a* and 22*b* without disassembling the vibration-suppressing mechanism 20. Therefore, it is easy to temporarily detach the actuators 22*a* and 22*b* at the time of baking the column 2 or to replace the actuators 22*a* and 22*b* at the time of failure or at the lifetime (at the time of periodic replacement), and thus it is possible to improve the maintainability.

Since the actuator 22*a* and the vibration sensor 23*a* face each other in the X-direction, and the actuator 22*b* and the vibration sensor 23*b* face each other in the Y-direction, it is possible to detect and reduce vibration in any direction in an XY plane of the column 2.

As described above, according to the present embodiment, the charged particle beam device 100 includes the sample chamber 1 for accommodating the sample 6 which will serve as an object to be observed therein, the column 2 that is disposed at the upper portion of the sample chamber 1 and irradiates and scans the sample 6 with the charged particle beam (primary electron beam 8) generated from a charged particle source (electron gun 7), and the vibration-suppressing mechanism 20 that is removably provided to the column 2. The vibration-suppressing mechanism 20 is configured to include the stator 21*b* affixed to the column 2, the annular mover 21*a* that is supported so as to be movable in the direction (X and Y-directions) orthogonal to the axial direction of the column 2, and the plurality of actuators 22*a* and 22*b* that cause the mover 21*a* to vibrate in the direction (X and Y-directions) orthogonal to the axial direction of the column 2, the plurality of vibration sensors 23*a* and 23*b* affixed to the stator 21*b*, and the controller 24 that controls the actuators 22*a* and 22*b* according to output signals of the vibration sensors 23*a* and 23*b*.

When the column 2 is viewed from the axial direction, the mover 21*a* is disposed inside the stator 21*b*, and the actuators 22*a* and 22*b* are provided on the stator 21*b* from the outside.

In addition, the mover 21*a* is supported by an elastic member (leaf spring 21*e*) having low rigidity with respect to the stator 21*b* in operation directions of the actuators 22*a* and 22*b*, and the actuators 22*a* and 22*b* attenuate the vibration generated in the column 2 by causing the mover 21*a* to vibrate with respect to the stator 21*b*.

In addition, the actuators 22*a* and 22*b* include a piezoelectric element, a case that applies a preload to the piezoelectric element to protect the piezoelectric element, and a tip end portion that protrudes from one end of the case and outputs displacement, and are configured so that the tip end portion stretches and contracts by the piezoelectric element.

In the present embodiment, the vibration-suppressing mechanism 20 is provided in a state in which the actuator 22*a* and the vibration sensor 23*a* face each other in the X-direction, and the actuator 22*b* and the vibration sensor 23*b* face each other in the Y-direction, but may be provided in a state of being rotated around the axis of the column 2. That is, it is not necessarily required to arrange a virtual straight line connecting the actuator 22*a* and the vibration sensor 23*a* and a virtual straight line connecting the actuator 22*b* and the vibration sensor 23*b* so as to be orthogonal to each other.

Since a vibration mode (vibration direction) of the column 2 does not necessarily coincide with the X and Y-directions, it is possible to facilitate the design of a control system by providing the actuators 22*a* and 22*b* and the vibration sensors 23*a* and 23*b* along the vibration mode (vibration direction) of the column 2.

In the vibration-suppressing action of the column 2, the annular mover 21*a* functions as a "weight" that reduces (attenuates) vibration. Since vibration of the column 2 is controlled by operating one mover 21*a* in two directions of the X-direction and the Y-direction, it is possible to reduce in weight of the vibration-suppressing mechanism 20 as compared with a case where movers are separately prepared in the X-direction and the Y-direction. In addition, since the mover 21*a* that operates is disposed inside the stator 21*b*, a movable portion hardly interferes with surrounding components, and thus it is possible to secure reliability and safety of the device.

The plurality of actuators 22*a* and 22*b* are desirably arranged such that the center of gravity of the mover 21*a* is located on a substantially intersection point of thrust lines of the plurality of actuators 22*a* and 22*b*. With such arrangement, it is possible to effectively attenuate the vibration generated in the column 2 only by the operations of the actuators 22*a* and 22*b*.

In addition, since the column 2 is a columnar structure, the vibration amplitude of the upper portion is generally likely to increase, and the upper portion having a large amplitude is desirable as a provision location of the vibration-suppressing mechanism 20 for effective damping.

In addition, when the electron gun 7 is disposed at the upper portion of the column 2, and an electromagnetic actuator that generates a magnetic field is used for the vibration-suppressing mechanism 20, the primary electron beam 8 is influenced and the observation image is adversely affected. By using a non-magnetic actuator, it is possible to suppress the influence on the observation image. Since the actuators 22*a* and 22*b* in the present embodiment are driven by the multilayer piezoelectric element, it is possible to control vibration without adversely affecting the observation image. Since the multilayer piezoelectric element has a high response speed, it is also possible to reduce vibration of a relatively high frequency.

In addition, in the present embodiment, the vibration-suppressing mechanism 20 is provided at the top portion of the column 2. However, depending on the vibration mode of the column 2 and the frequency of vibration, the vibration amplitude may be large at a portion other than the upper portion of the column 2, and the vibration-suppressing mechanism 20 may be provided at the position other than the top portion of the column 2. In this case, the inner diameter of the inertial mass member 21 may be set to be larger than the outer diameter of the column 2.

In addition, a plurality of vibration-suppressing mechanisms 20 may be provided in the column 2. By using the plurality of vibration-suppressing mechanisms 20, it is possible to effectively control vibration in a plurality of vibration modes.

Embodiment 2

A vibration-suppressing mechanism according to Embodiment 2 of the present invention will be described with reference to FIGS. 6 to 8. In the present embodiment, an example of a vibration-suppressing mechanism capable of obtaining a larger damping force than in Embodiment 1 will be described.

Figure 6:
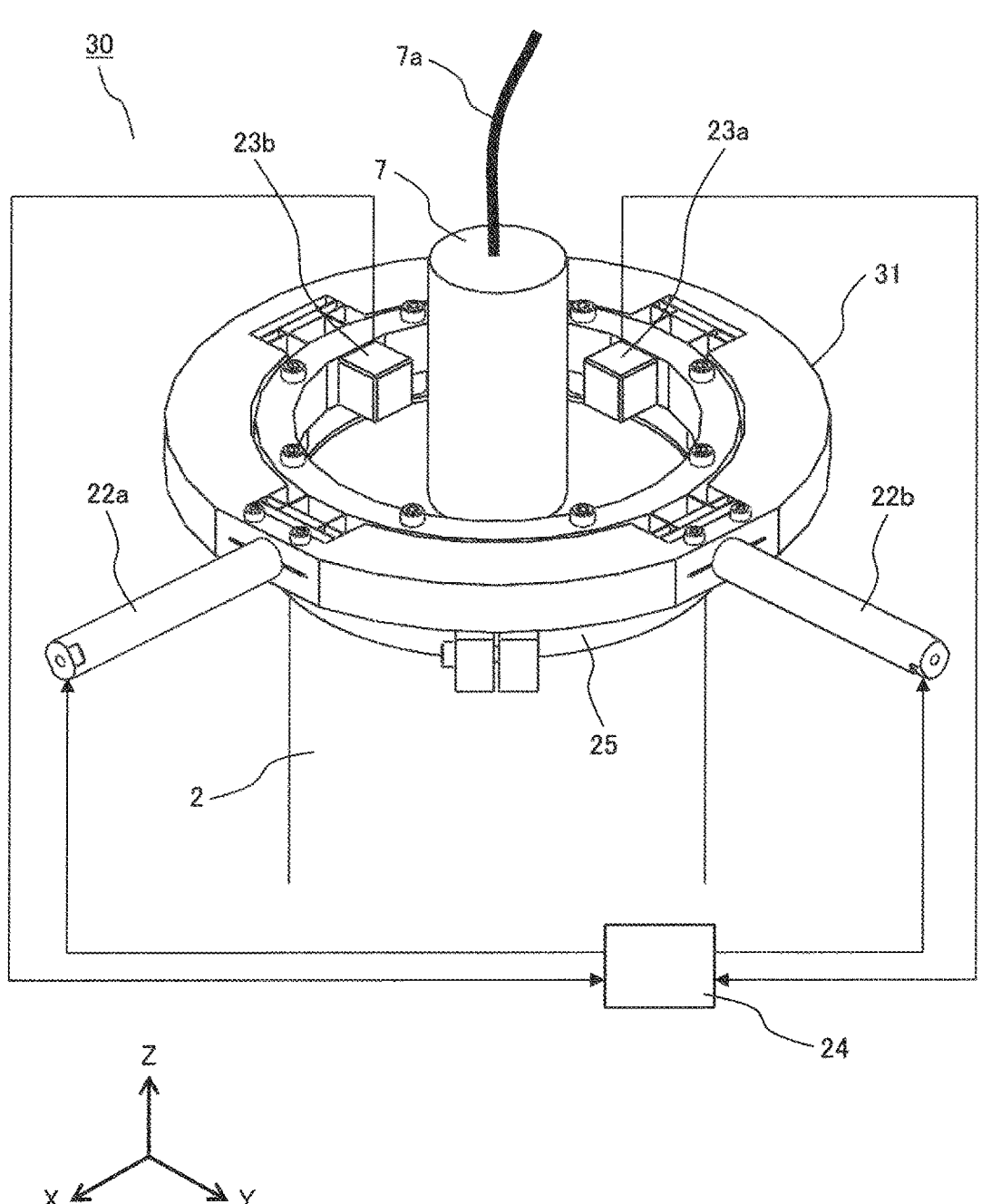
FIG. 6 is a perspective view of a vibration-suppressing mechanism in Embodiment 2.
Figure 7:
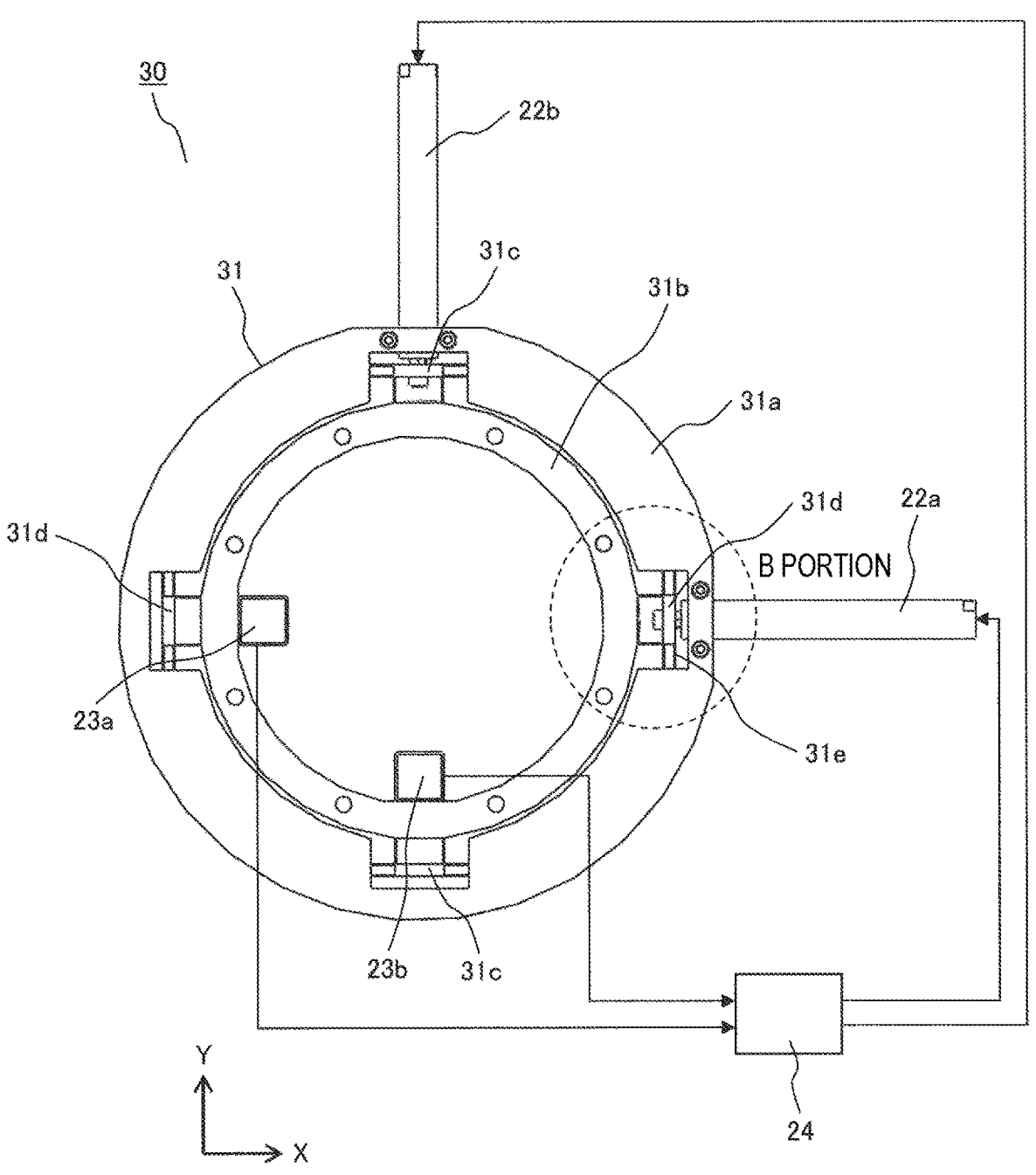
FIG. 7 is a plan view of the vibration-suppressing mechanism in Embodiment 2.
Figure 8:
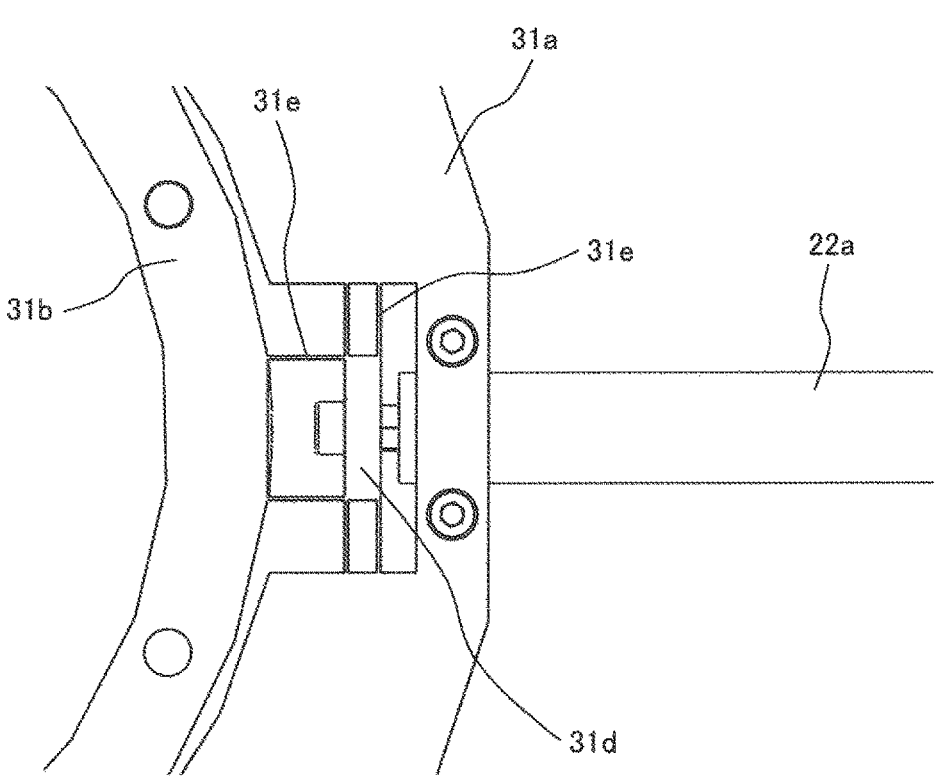
FIG. 8 is an enlarged view of a portion B in FIG. 7.
Figure 8:

FIGS. 6 and 7 are a perspective view and a plan view (top view) of a vibration-suppressing mechanism 30 in the present embodiment, and correspond to FIGS. 2 and 4 in Embodiment 1, respectively. FIG. 8 is an enlarged view of a portion B in FIG. 7.

As illustrated in FIG. 6, the fixing ring 25 is attached to the upper portion of the column 2, and the vibration-suppressing mechanism 30 is attached to the upper portion of the column 2 via the spacer 26 (not illustrated in FIG. 6).

The vibration-suppressing mechanism 30 includes an inertial mass member 31, the actuators 22a and 22b provided on the inertial mass member 31, the vibration sensors 23a and 23b provided on the inertial mass member 31, and the controller 24 that drives and controls the actuators 22a and 22b according to output signals of the vibration sensors 23a and 23b.

The inertial mass member 31 includes a stator 31b and an annular mover 31a outside the stator 31b. The stator 31b is affixed to the fixing ring 25 via the spacer 26 (not illustrated). The mover 31a and the stator 31b are coupled to each other via an X-direction mover 31c, a Y-direction mover 31d, and a leaf spring 31e. The inertial mass member 31 may be formed as an integral component in which a portion for the leaf spring 31e is thinned.

The X-direction mover 31c is coupled to the stator 31b by the leaf spring 31e having a parallel flat plate structure, and is supported with low rigidity in the X-direction with respect to the stator 31b. Similarly, the Y-direction mover 31d is coupled to the stator 31b by the leaf spring 31e having a parallel flat plate structure, and is supported with low rigidity in the Y-direction with respect to the stator 31b.

The annular mover 31a is coupled to the X-direction mover 31c by the leaf spring 31e having a parallel plate structure, and is supported with low rigidity in the Y-direction with respect to the X-direction mover 31c. In addition, the mover 31a is coupled to the Y-direction mover 31d by the leaf spring 31e having a parallel plate structure, and is supported with low rigidity in the X-direction with respect to the Y-direction mover 31d.

The actuators 22a and 22b are inserted from the outside of the mover 31a in a state where the tip end portions face the stator 31b. The metal cases of the actuators 22a and 22b are affixed to the mover 31a.

The tip end portion of the actuator 22a is connected to the Y-direction mover 31d, and the tip end portion of the actuator 22b is connected to the X-direction mover 31c.

When the actuator 22a stretches and contracts, the mover 31a and the X-direction mover 31c operate in the X-direction. When the actuator 22b stretches and contracts, the mover 31a and the Y-direction mover 31d operate in the Y-direction. Since the stretch/contraction amounts of the actuators 22a and 22b are minute, the mover 31a can be independently operated in the X and Y-directions by the actuators 22a and 22b.

The vibration-suppressing mechanism 30 uses the drive reaction force of the mover 31a as a damping force against vibration generated in the column 2. The vibration sensors 23a and 23b are affixed to the stator 31b so as to detect vibration in the X-direction and the Y-direction, respectively. The vibration sensors 23a and 23b may be affixed to the column 2 or the fixing ring 25 so as to detect vibration of the column 2.

As described above, in the charged particle beam device in the present embodiment, when the column 2 is viewed from the axial direction, the mover 31a is disposed outside the stator 31b, and the actuators 22a and 22b are provided on the mover 31a from the outside.

In the present embodiment, since the mover 31a is located outside the stator 31b, it is necessary to pay attention to interference between the movable portion and surrounding components, but it is easy to increase the damping force of the vibration-suppressing mechanism 30 by increasing the size of the mover 31a. Other effects are the same as those in Embodiment 1.

Note that, the present invention is not limited to the above embodiments, and various modifications may be provided.

For example, the above embodiments are described in detail in order to aid in understanding the present invention, and are not necessarily limited to a case including all the described components. Further, some components in one embodiment can be replaced with the components in another embodiment, and the configuration of another embodiment can be added to the configuration of one embodiment. Regarding some components in the embodiments, other components can be added, deleted, and replaced.

REFERENCE SIGNS LIST 1 sample chamber
2 column
3 X table
4 Y table
5 sample stage
6 sample
7 electron gun
7a cable (of electron gun)
8 primary electron beam
9 condenser lens
10 scanning deflector
11 objective lens
12 ion pump
20, 30 vibration-suppressing mechanism
21, 31 inertial mass member
21a, 31a mover
21b, 31b stator
21c, 31c X-direction mover
21d, 31d Y-direction mover
21e, 31e leaf spring
22a, 22b actuator
23a, 23b vibration sensor
24 controller
25 fixing ring
26 spacer
100 charged particle beam device

The invention claimed is:
1. A charged particle beam device comprising:
a sample chamber for accommodating a sample that will serve as an object to be observed therein;

a column that is disposed on an upper portion of the sample chamber and irradiates and scans the sample with a charged particle beam generated by a charged particle source; and a vibration-suppressing mechanism that is removably provided to the column, wherein the vibration-suppressing mechanism includes a fixing ring attached to an upper portion of the column, a stator affixed to the fixing ring via a spacer, such that an entirety of the stator is disposed above the fixing ring and the upper portion of the column, wherein an axial direction of the spacer is parallel to an axial direction of the column, an annular mover that is supported so as to be movable in a direction orthogonal to the axial direction of the column, a plurality of actuators that cause the mover to vibrate in the direction orthogonal to the axial direction of the column, a plurality of vibration sensors affixed to the stator, and a controller that controls the actuators according to output signals from the vibration sensors, wherein the mover is supported by an elastic member having elasticity with respect to the stator in an operation direction of the actuators, and wherein the actuators cause the mover to vibrate with respect to the stator to attenuate vibration generated in the column.

2. The charged particle beam device according to claim 1, wherein, when the column is viewed from the axial direction, the mover is disposed inside the stator, and the actuators are provided on the stator from an outside.

3. The charged particle beam device according to claim 1, wherein, when the column is viewed from the axial direction, the mover is disposed outside the stator, and the actuators are provided on the mover from an outside.

4. The charged particle beam device according to claim 1, wherein each of the actuators includes a piezoelectric element, a case for protecting the piezoelectric element by applying a preload to the piezoelectric element, and a tip end portion that protrudes from one end of the case and outputs displacement, and the tip end portion stretches and contracts by the piezoelectric element.

5. The charged particle beam device according to claim 1, wherein a center of gravity of the mover is located on a substantially intersection point of thrust lines of the plurality of actuators.

6. The charged particle beam device according to claim 1, wherein the stator includes a recessed portion in which the elastic member is disposed.

7. The charged particle beam device according to claim 6, wherein the elastic member is disposed in the operation direction of the actuators between an outer periphery of the stator and an outer periphery of the mover.

8. A vibration-suppressing mechanism that is removably provided to a column of a charged particle beam device and suppresses vibration generated in the column, the vibration-suppressing mechanism comprising:

a fixing ring attached to an upper portion of the column;

a stator affixed to the fixing ring via a spacer, such that an entirety of the stator is disposed above the fixing ring and the upper portion of the column, wherein an axial direction of the spacer is parallel to an axial direction of the column;

an annular mover that is supported so as to be movable in a direction orthogonal to an axial direction of the column;

a plurality of actuators that cause the mover to vibrate in the direction orthogonal to the axial direction of the column;

a plurality of vibration sensors affixed to the stator; and a controller that controls the actuators according to output signals from the vibration sensors;

wherein the mover is supported by an elastic member having elasticity with respect to the stator in an operation direction of the actuators, and wherein the actuators cause the mover to vibrate with respect to the stator to attenuate vibration generated in the column.

9. The vibration-suppressing mechanism according to claim 8, wherein the mover is disposed inside the stator, and the actuators are provided on the stator from an outside.

10. The vibration-suppressing mechanism according to claim 8, wherein the mover is disposed outside the stator, and the actuators are provided on the mover from an outside.

11. The vibration-suppressing mechanism according to claim 8, wherein each of the actuators includes a piezoelectric element, a case for protecting the piezoelectric element by applying a preload to the piezoelectric element, and a tip end portion that protrudes from one end of the case and outputs displacement, and the tip end portion stretches and contracts by the piezoelectric element.

12. The vibration-suppressing mechanism according to claim 8, wherein a center of gravity of the mover is located on a substantially intersection point of thrust lines of the plurality of actuators.

13. The vibration-suppressing mechanism according to claim 8, wherein the stator includes a recessed portion in which the elastic member is disposed.

14. The vibration-suppressing mechanism according to claim 13, wherein the elastic member is disposed in the operation direction of the actuators between an outer periphery of the stator and an outer periphery of the mover.

* * * * *